(12) United States Patent
Schwarz et al.

(10) Patent No.: US 7,112,834 B1
(45) Date of Patent: Sep. 26, 2006

(54) GATE ETCH PROCESS

(75) Inventors: Benjamin Schwarz, San Jose, CA (US); Chan-Lon Yang, Los Gatos, CA (US); Kiyoko Ikeuchi, Sunnyvale, CA (US); Peter Keswick, Bloomington, MN (US); Lien Lee, Bloomington, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 213 days.

(21) Appl. No.: 10/791,657

(22) Filed: Mar. 2, 2004

Related U.S. Application Data

(63) Continuation of application No. 10/099,841, filed on Mar. 15, 2002, now Pat. No. 6,699,795.

(51) Int. Cl.
*H01L 29/76* (2006.01)

(52) U.S. Cl. .................. 257/288; 257/327; 257/368; 257/E21.001; 438/585; 438/197; 438/710; 438/724

(58) Field of Classification Search ............... 257/288, 257/327, 368; 438/197, 585, 710, 724
See application file for complete search history.

(56) References Cited

U.S. PATENT DOCUMENTS

| | | | |
|---|---|---|---|
| 4,174,251 A | 11/1979 | Paschke | |
| 4,568,410 A | 2/1986 | Thornquist | |
| 4,654,114 A | 3/1987 | Kadomura | |
| 4,808,259 A | 2/1989 | Jillie et al. | |
| 5,279,705 A | 1/1994 | Tanaka | |
| 5,928,967 A | 7/1999 | Radens et al. | |
| 5,989,979 A | 11/1999 | Liu et al. | |
| 6,235,644 B1 | 5/2001 | Chou | |
| 6,296,780 B1 | 10/2001 | Yan et al. | |
| 6,307,174 B1 | 10/2001 | Yang et al. | |
| 6,379,872 B1 | 4/2002 | Hineman et al. | |
| 6,399,514 B1 | 6/2002 | Marks et al. | |
| 6,428,716 B1 | 8/2002 | Demmin et al. | |
| 6,451,703 B1 | 9/2002 | Liu et al. | |
| 6,461,969 B1 | 10/2002 | Lee et al. | |

OTHER PUBLICATIONS

Wolf, "Silicon Processing for the VLSI Era", vol. 1-Process Technology, pp. 550-556, Nov. 1999.

*Primary Examiner*—Zandra V. Smith
*Assistant Examiner*—Christy Novacek
(74) *Attorney, Agent, or Firm*—Evan Law Group LLC

(57) ABSTRACT

A method of making a semiconductor structure includes etching an anti-reflective coating layer at a pressure of 10 millitorr or less; etching a nitride layer with a first nitride etch plasma having a first F:C ratio; and etching the nitride layer with a second nitride etch plasma having a second F:C ratio. The first F:C ratio is greater than the second F:C ratio.

7 Claims, 3 Drawing Sheets

GATE ETCH PROCESS

CROSS REFERENCE TO RELATED APPLICATION

This application is a continuation application of U.S. application Ser. No. 10/099,841 filed 15 Mar. 2002, now U.S. Pat. No. 6,699,795.

BACKGROUND

Modern integrated circuits are constructed with up to several million active devices, such as transistors and capacitors, formed in a semiconductor substrate. Interconnections between the active devices are created by providing a plurality of conductive interconnection layers, such as polysilicon and metal, which are etched to form conductors for carrying signals between the various active devices. The conductive layers and interlayer dielectric are deposited on the silicon substrate wafer in succession, with each layer being, for example, of the order of 1 micron in thickness.

A common intermediate structure for constructing integrated circuits is the stack shown diagrammatically in FIG. 1. This structure has a gate oxide (GOX, 10), which supports a layer of polycrystalline silicon (polysilicon, 12). Above the polysilicon layer is a layer of silicon nitride (14), followed by a layer of an anti-reflective coating (ARC, 16). Finally, a resist material 18 is present on top of the structure. The resist layer is patterned, followed by etching of the structure in the regions not covered by the resist material, allowing for the formation of functional elements within the structure, such as gates.

The conventional etching process for a structure such as the stack is illustrated in the diagram of FIG. 2. In this illustration, the etching steps are represented as patterned boxes, and an individual step etches the layer shown to the left of the etch box. Overetch steps are indicated by the fact that the lower limit of the etch box is positioned below the lower limit of the layer box. The step of etching the ARC, 20, is performed at medium pressure; and an overetch step, as indicated by the lower boundary of the etch positioned below the lower boundary of the ARC 16, is employed to insure the complete removal of the ARC. This etch is followed by a nitride etch step 22, using a low ratio of $CF_4$ to $CHF_3$, to overetch the silicon nitride layer 14. Finally, a main etch step 24 of the polysilicon 12 followed an overetch step 26 removes all material except the GOX base 10.

During this etching, defects can be formed which span the entire height of the stack, i.e. from the GOX base to the resist layer. These cylindrical defects, having a diameter from 50–80 nanometers (nm), are known as "drips." The number of drips in a typical structure is from 50–100 drips per square centimeter (drips/cm$^2$). These defects cause contact open and single bit failure, resulting in structures which are not useful. Efforts to minimize the number of drips have come at the expense of critical dimension (CD) control, meaning that the size of the desired structural element formed is too large. There is thus a need for an etching process which can reduce the number of drips while maintaining acceptable CD control.

BRIEF SUMMARY

In a first aspect, the present invention is a method of making a semiconductor structure, comprising etching an anti-reflective coating layer with an ARC etch plasma at a pressure of at most 10 millitorr; etching a nitride layer with a first nitride etch plasma having a first F:C ratio; and etching the nitride layer with a second nitride etch plasma having a second F:C ratio. The first F:C ratio is greater than the second F:C ratio.

In a second aspect, the present invention is a method of making a semiconductor structure, comprising etching an anti-reflective coating layer at a pressure of at most 6 millitorr; overetching the anti-reflective coating layer; etching a nitride layer with a first nitride etch plasma having a F:C ratio of at least 3.8; etching the nitride layer with a second nitride etch plasma having a F:C ratio at most 3.7; and overetching the nitride layer with the second nitride etch plasma. The semiconductor structure has at most 1 drip per square centimeter and has a minimum feature size of at most 1.8 micrometers.

In a third aspect, the present invention is a semiconductor structure, comprising a gate oxide; a polysilicon layer on the gate oxide; a silicon nitride layer on the polysilicon layer; and an anti-reflective coating layer on the polysilicon layer. The semiconductor structure has a minimum feature size of at most 1.8 micrometers and has at most 10 drips per square centimeter.

In a fourth aspect, the present invention is, in a method of making a semiconductor structure including etching an anti-reflective coating layer with an ARC etch plasma, etching a nitride layer, and etching a polysilicon layer; the improvement comprising applying the ARC etch plasma at a pressure of at most 10 millitorr; and etching the nitride layer with a first nitride etch plasma having a first F:C ratio, followed by a second nitride etch plasma having a second F:C ratio. The first F:C ratio is greater than the second F:C ratio.

DETAILED DESCRIPTION

The present invention includes a method for performing a gate etch with acceptable control of the critical dimension (CD) such that only a low number of cylindrical defects (drips) are formed. The method includes a low pressure anti-reflective coating (ARC) etch and a multiple step nitride etch process. The method can be used to provide semiconductor structures.

The gate etch process makes use of the recognition that drip formation is due mainly to the ARC etch and to the nitride etch of the top portion of the silicon nitride layer. Defects that only exist in the top portion of the silicon nitride can be removed with a cleaning procedure, such as exposure to HF. Defects such as drips, which extend from the ARC through the silicon nitride layer, are not so easily removed, and thus a change in the chemical makeup of the etching agent has now been developed. Modifications to the etching agent include using a lower pressure in the ARC etch; addition of oxygen ($O_2$) to the ARC etch and/or to the first nitride etch; and the use of a high fluorine to carbon ratio (F:C) during the first nitride etch. The duration of the ARC etch and the second nitride etch may also be extended so as to provide a more lengthy overetch.

Figure 1:
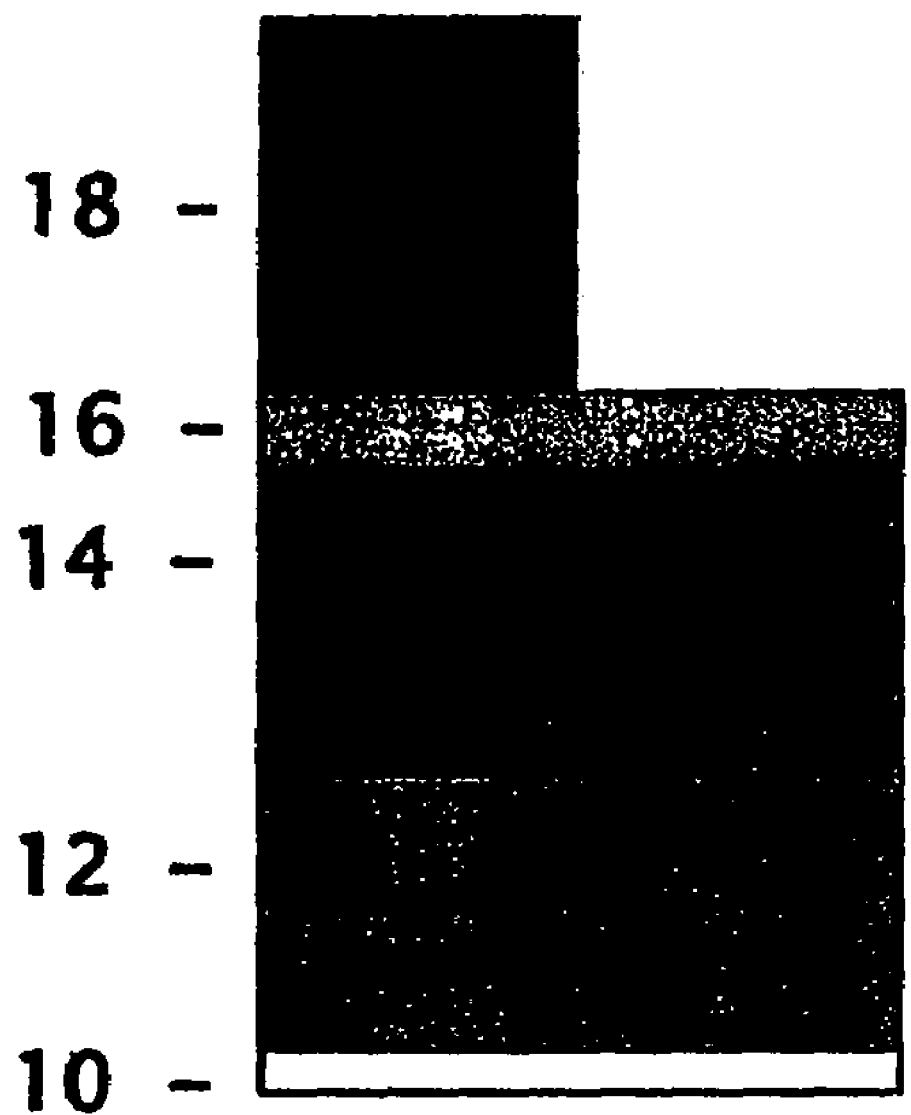
FIG. 1 is a diagram of a stack
Figure 2:
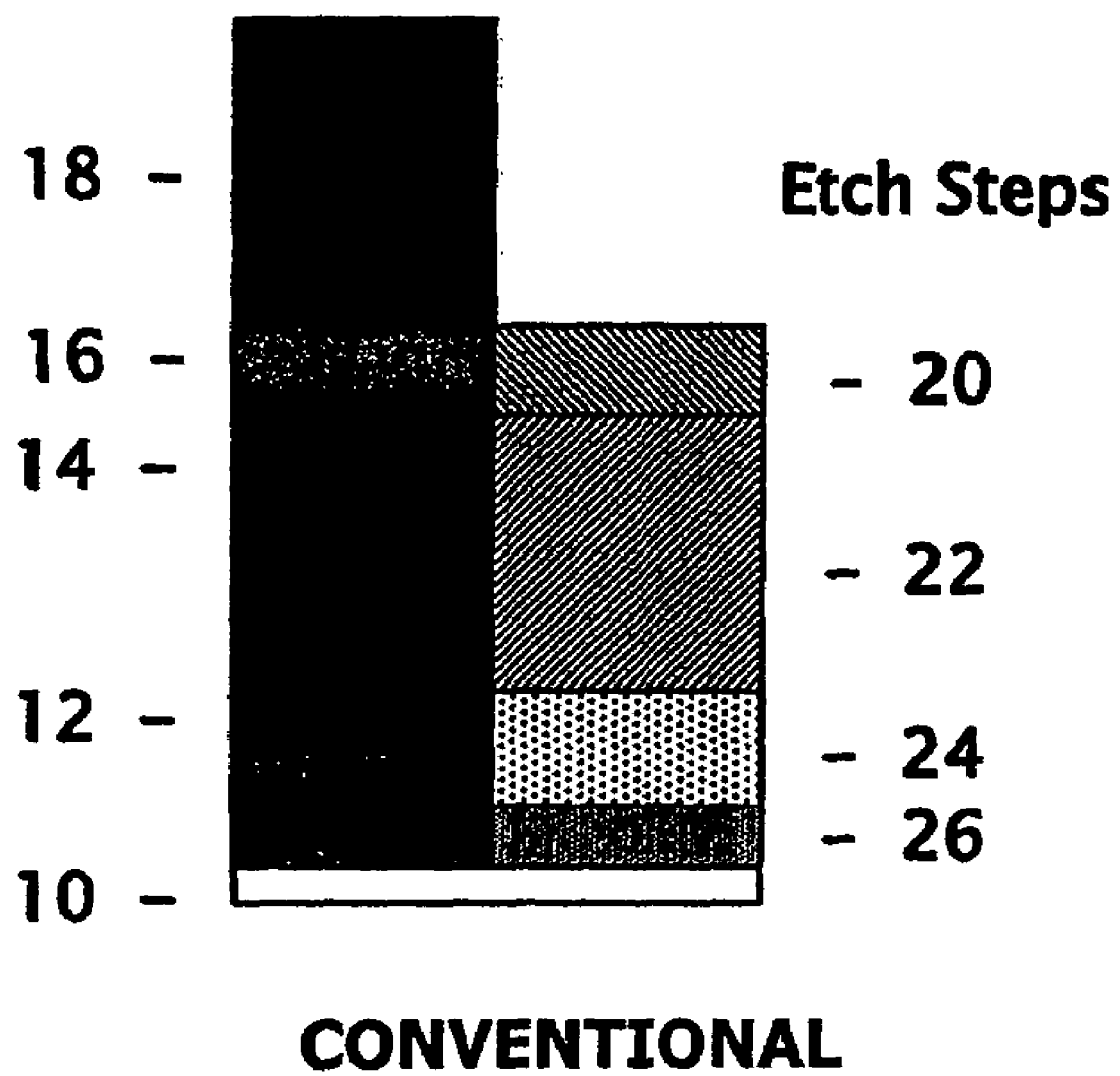
FIG. 2 is a diagram illustrating a conventional etch process.
Figure 3:
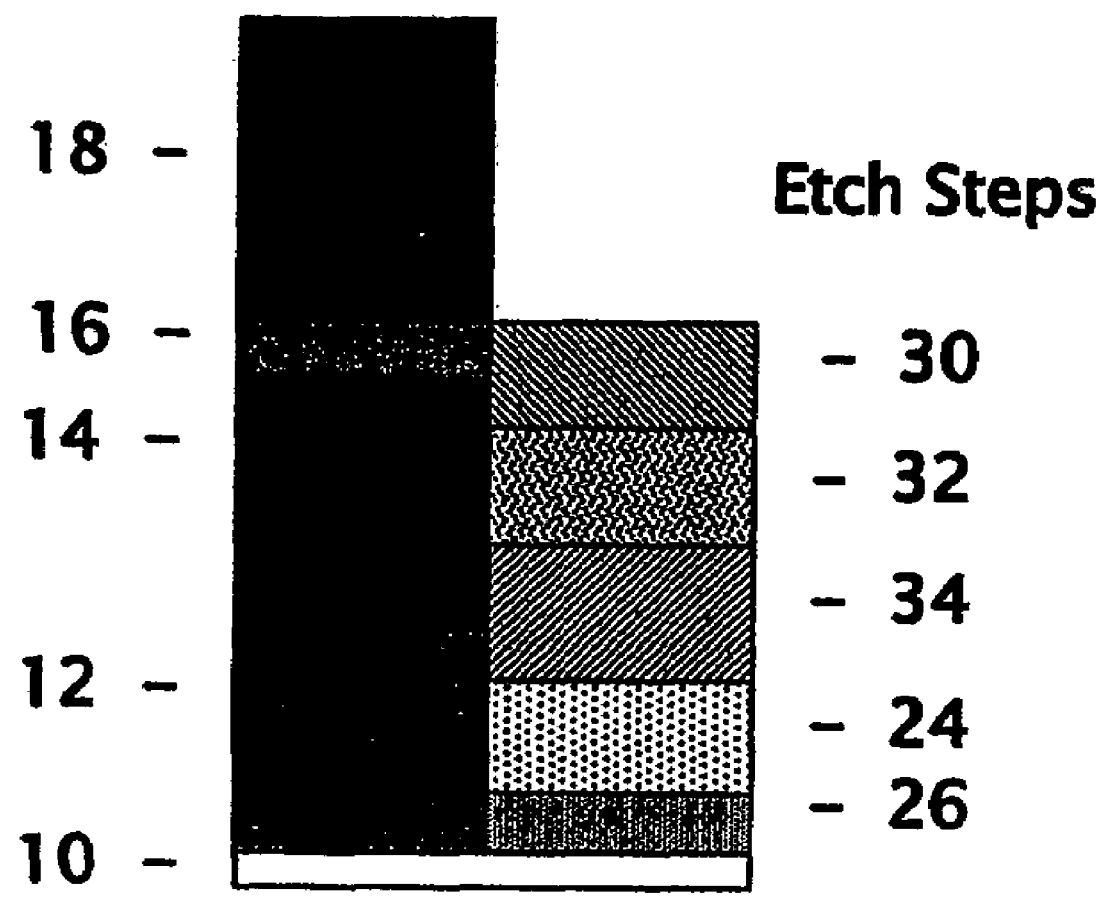
FIG. 3 is a diagram illustrating an embodiment of the improved etch process.

The gate etch process of the present invention is illustrated in the diagram of FIG. 3. First, a low pressure ARC etch 30 is performed to overetch the ARC layer 16. The etching agent in this process has a F:C of at least 4, and the pressure of the gas applied is 10 millitorr (mtorr) or less. The etching agent may, for example, be prepared from $CF_4$. Preferably, the pressure of the gas applied is 6 mtorr or less. More preferably, the pressure of the applied gas is between 0.1 and 6 mtorr. The overetch used in this process is carried out for a longer time than the conventional overetch 20.

The nitride etch is then performed as a two-step process. The etching agents for the nitride etch may be prepared from mixtures of $CF_4$ and $CHF_3$. The first nitride etch 32 uses a F:C ratio of at least 3.8. The second etch 34 uses a F:C ratio which is 3.7 or less, and is applied to etch and overetch the silicon nitride layer. Preferably, the first nitride etch 32 uses a F:C ratio of between 3.8 and 4.0. Preferably, the second nitride etch 34 uses a F:C ratio which is between 3.0 and 3.7. In either nitride etch, oxygen may be added to the etching agent.

The polysilicon 12 can be etched with standard processes for the main etch 24 and overetch 26. Typically, the plasma etching of polysilicon is performed with chlorinating agents such as $Cl_2$ or a combination of $BCl_3$ and a halogenated hydrocarbon. The polysilicon etch can also be performed with combinations of, for example, $SiCl_4$, $BCl_3$, HBr, $Br_2$, $SF_6$, and $CF_4$.

In preparing a plasma for use as an etching agent for the ARC etch or for the first or second nitride etches, gases may be used in addition to or in place of $CF_4$ and $CHF_3$. For example, other fluorinated gases may be used, such as $C_2F_6$, $C_2H_2F_6$, $CH_2F_2$, $CH_3F$, $C_2F_8$, XeF, $NF_3$, $SF_6$, and HF. Inert gases may also be used, including helium, xenon, argon, and nitrogen. Other gases which may be present include $O_2$, $CO_2$, HBr, and $Cl_2$. Since the etching agent is present as a plasma of charged atoms, it is more useful to refer to atomic ratios and abundances within the plasma than to focus on the substances used to make the plasma. Thus, any combination of gases may be used to provide etching agents with the desired ratios of carbon, fluorine, and hydrogen.

It is believed that a high F:C ratio tends to reduce the quality of the CD control of the etching process. The presence of oxygen likewise can decrease the number of drips, but also contributes to undesirable shrinkage of the resist. In the ARC etch and the first nitride etch, the use of etching agents having a high F:C ratio and/or $O_2$ thus contribute to the reduction in drip count. The acceptable CD control is then provided by the conventional nitride etch (low F:C ratio) used for the lower portion of the nitride etch. The gate etch process is particularly helpful for making semiconductor structures having feature sizes of 1.8 µm or smaller, for example 1.6 µm or smaller. The gate etch process provides acceptable CD control while reducing the number of drips to 10 or fewer drips/cm². Preferably, the gate etch process provides acceptable CD control while reducing the number of drips to 8 or fewer drips/cm². More preferably, the gate etch process provides acceptable CD control while reducing the number of drips to 1 or fewer drips/cm². This drip count is a reduction by up to two orders of magnitude relative to the drip count from conventional etch processes.

Defects can be measured by standard imaging techniques. The drips are coated with nitride to enlarge the drip, and the number of drips in a given area can be counted, for example by scanning electron microscopy (SEM) in combination with a defect tool.

The related processing steps, polishing, cleaning, and deposition steps, for use in the present invention are well known to those of ordinary skill in the art, and are also described in Encyclopedia of Chemical Technology, Kirk-Othmer, Volume 14, pp. 677–709 (1995); Semiconductor Device Fundamentals, Robert F. Pierret, Addison-Wesley, 1996; Wolf, Silicon Processing for the VLSI Era, Lattice Press, 1986, 1990, 1995 (vols 1–3, respectively), and Microchip Fabrication 4rd. edition, Peter Van Zant, McGraw-Hill, 2000.

The semiconductor structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, an airplane or an automobile.

EXAMPLES

Example 1

Conventional Etch Process

An etch process was performed on a R7-1.8 stack using a conventional sequence of etching agents. The ARC etch was performed using $CF_4$ at a flow rate of 100 sccm and 80% $He/O_2$ at 8 sccm, with a total pressure of 16 mtorr. This etch was carried out either for the time limit of 55 seconds, or until 95% of the ARC was removed, whichever occurred first. The ARC overetch was then performed under the same conditions for an etch time which was 40% of the duration of the ARC etch.

The nitride etch was performed using a ratio of $CF_4$ (68 sccm) to $CHF_3$ (32 sccm) which was approximately 2:1, with a total pressure of 15 mtorr. This corresponds to an F:C ratio of 3.67. The nitride etch was carried out either for the time limit of 100 seconds, or until 85% of the nitride layer was removed, whichever occurred first. The nitride overetch was then performed under the same conditions for an etch time which was 30% of the duration of the nitride etch.

The main polysilicon etch was performed with the following sequence of etching agents:

1) 30 sccm $Cl_2$; 5 sccm 80% $He/O_2$; 160 sccm HBr; pressure of 10 mtorr; for 32 seconds;

2) 12 sccm 80% $He/O_2$; 180 sccm HBr; pressure of 30 mtorr; for 3 seconds; and 3) 12 sccm 80% $He/O_2$; 180 sccm HBr; pressure of 80 mtorr; to endpoint of 101% removal of polysilicon, up to 50 seconds.

Overetch of the polysilicon layer was performed, first with 12 sccm 80% $He/O_2$ and 180 sccm HBr, at a pressure of 80 mtorr, for 45 seconds; followed by 100 sccm $O_2$ at a pressure of 80 mtorr for 10 seconds.

Example 2

Etch Process Including Oxide Etcher for ARC

An etch process was performed on a R7-1.8 stack using another sequence of etching agents. The ARC etch was performed using $CF_4$ at a flow rate of 18 sccm, $CHF_3$ at 12 sccm, and $O_2$ at 8 sccm, with a total pressure of 50 mtorr for a duration of 45 seconds. The ARC overetch was then performed with $CF_4$ at a flow rate of 100 sccm and 80% $He/O_2$ at 8 sccm, with a total pressure of 16 mtorr for 20 seconds.

The nitride etch was performed using a ratio of $CF_4$ (68 sccm) to $CHF_3$ (32 sccm) which was approximately 2:1, with a total pressure of 15 mtorr. The nitride etch was carried out either for the time limit of 40 seconds, or until 85% of the nitride layer was removed, whichever occurred first. The nitride overetch was then performed under the same conditions for an etch time which was 65% of the duration of the nitride etch.

The main polysilicon etch was performed with the following sequence of etching agents:

1) 30 sccm $Cl_2$; 5 sccm 80% $He/O_2$; 160 sccm HBr; pressure of 10 mtorr; for 26 seconds;

2) 8 sccm 80% $He/O_2$; 180 sccm HBr; pressure of 30 mtorr; for 3 seconds; and 3) 8 sccm 80% $He/O_2$; 180 sccm HBr; pressure of 80 mtorr; for 85 seconds.

Example 3

Gate Etch Process Using Modified Etching Agents and 2-Step Nitride Etch

An etch process was performed on a R7-1.8 stack using a low pressure ARC etch, and a 2-step nitride etch where the first nitride etch uses a high F:C ratio. The ARC etch was performed using $CF_4$ at a flow rate of 100 sccm and 80% $He/O_2$ at 4 sccm, with a total pressure of 6 mtorr. This etch was carried out either for the time limit of 55 seconds, or until 95% of the ARC was removed, whichever occurred first. The ARC overetch was then performed using the same plasma composition, but with a pressure of 16 mtorr. The overetch time was 35% of the duration of the ARC etch.

The first nitride etch was performed using a ratio of $CF_4$ (80 sccm) to $CHF_3$ (20 sccm) which was approximately 4:1, with a total pressure of 15 mtorr. This corresponds to an F:C ratio of 3.8. This first nitride etch was carried out for 25 seconds.

The second nitride etch was performed using a ratio of $CF_4$ (68 sccm) to $CHF_3$ (32 sccm) which was approximately 2:1, with a total pressure of 15 mtorr. This corresponds to an F:C ratio of 3.67. The nitride etch was carried out either for the time limit of 100 seconds, or until 85% of the nitride layer was removed, whichever occurred first. The nitride overetch was then performed under the same conditions, for an etch time which was 36% of the duration of the nitride etch.

The main polysilicon etch was performed, first with 30 sccm $Cl_2$, 5 sccm 80% $He/O_2$, and 160 sccm HBr at a pressure of 10 mtorr for 27 seconds; followed by 20 sccm 80% $He/O_2$, 190 sccm HBr at a pressure of 30 mtorr for 11 seconds.

Overetch of the polysilicon layer was performed, first with 12 sccm 80% $He/O_2$ and 180 sccm HBr, at a pressure of 80 mtorr, for 110 seconds; followed by 100 sccm $O_2$ at a pressure of 80 mtorr for 10 seconds.

Example 4

Comparison of Conventional Etching and Gate Etch Process Using Modified Etching Agents The etched products of Examples 1–3 were analyzed for defects and CD control using a KLA ES20. The CD control was measured for the CCD line and the MOD feature. The etch bias was calculated as the change in line width during the etching process, and is defined as the feature dimension after etch minus the feature dimension before etch. It is desirable to have a large negative bias, a low standard deviation ($\sigma$) of the dimensions of the features, and a low concentration of drips (drips/cm$^2$). The characteristics of structure parameters after etching are given in Table A.

TABLE A

|  | Example 1 | Example 2 | Example 3 |
| --- | --- | --- | --- |
| CCD line before etch (nm) | 189 | 189 | 189 |
| CCD line after etch ± 3σ (nm) | 181 (±18) | 182.7 (±20) | 173 (±15) |
| CCD Etch bias | −5 | −5 | −10 |
| MOD feature before etch (nm) | 180 | 180 | 180 |
| MOD feature after etch ± 3σ (nm) | 181 (±14) | 177 (±20) | 168 (±17) |
| MOD Etch bias | −4 | −1 | −8 |
| drips/total defects |  | 4/19 | 5/9 |
| drips/cm$^2$ | 50–600 | 0.62 | 0.78 |

The invention claimed is:

1. A semiconductor structure, comprising:
   a gate oxide;
   a polysilicon layer on the gate oxide;
   a silicon nitride layer on the polysilicon layer; and
   an anti-reflective coating layer on the polysilicon layer;
   wherein the semiconductor structure has a minimum feature size of at most 1.8 micrometers and has at most 10 drips per square centimeter.

2. The semiconductor structure of claim 1, having at most 8 drips per square centimeter.

3. The semiconductor structure of claim 1, having at most 1 drip per square centimeter.

4. The semiconductor structure of claim 1, prepared by a method comprising:
   etching the anti-reflective coating layer with an ARC etch plasma at a pressure of at most 10 millitorr;
   etching the nitride layer with a first nitride etch plasma having a first F:C ratio; and
   etching the nitride layer with a second nitride etch plasma having a second F:C ratio;
   wherein the first F:C ratio is greater than the second F:C ratio.

5. The semiconductor structure of claim 4, wherein the semiconductor structure comprises at most 8 drips per square centimeter.

6. The semiconductor structure of claim 4, wherein the semiconductor structure comprises at most 1 drip per square centimeter.

7. The semiconductor structure of claim 1, prepared by a method comprising:
   etching an anti-reflective coating layer at a pressure of at most 6 millitorr;
   overetching the anti-reflective coating layer;
   etching a nitride layer with a first nitride etch plasma having a F:C ratio of at least 3.8;
   etching the nitride layer with a second nitride etch plasma having a F:C ratio at most 3.7; and
   overetching the nitride layer with the second nitride etch plasma;
   wherein the semiconductor structure has at most 1 drip per square centimeter, and has a minimum feature size of at most 1.8 micrometers.

* * * * *